United States Patent
Kwon

(10) Patent No.: US 7,562,183 B2
(45) Date of Patent: *Jul. 14, 2009

(54) FLASH MEMORY SYSTEM AND DATA WRITING METHOD THEREOF

(75) Inventor: Jeong-Mi Kwon, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/857,900

(22) Filed: Sep. 19, 2007

(65) Prior Publication Data

US 2008/0028133 A1    Jan. 31, 2008

Related U.S. Application Data

(63) Continuation of application No. 10/869,022, filed on Jun. 16, 2004, now Pat. No. 7,290,082.

(30) Foreign Application Priority Data

Jul. 23, 2003    (KR) ............... 10-2003-0050502

(51) Int. Cl.
*G06F 12/00* (2006.01)

(52) U.S. Cl. .................................................. 711/103

(58) Field of Classification Search .................. None
See application file for complete search history.

(56) References Cited

U.S. PATENT DOCUMENTS 6,256,762 B1    7/2001  Beppu
2003/0101405 A1    5/2003  Shibata

*Primary Examiner*—Kevin Verbrugge
(74) *Attorney, Agent, or Firm*—F. Chau & Associates, LLC

(57) ABSTRACT

Provided are a flash memory system and a data writing method thereof, the method including (a) transmitting a predetermined command and an address signal to a flash memory device included in the flash memory system, (b) transmitting data to the flash memory device, and (c) generating a parity code for the data and transmitting the parity code to the flash memory device, where the steps (b) and (c) are repeated twice or more; and where the data and the corresponding parity codes are written in a page buffer of the flash memory device irrespective of a data field and a spare field.

19 Claims, 3 Drawing Sheets ered reference in its entirety, which, in turn, claims foreign priority
FLASH MEMORY SYSTEM AND DATA WRITING METHOD THEREOF

CROSS-REFERENCE TO RELATED APPLICATION

This application is a continuation application of U.S. patent application Ser. No. 10/869,022, now U.S. Pat. No. 7,290,082 filed on Jun. 16, 2004, and entitled FLASH MEMORY SYSTEM AND DATA WRITING METHOD THEREOF, the disclosure of which is incorporated herein by reference in its entirety, which, in turn, claims foreign priority under 35 U.S.C. § 119 to Korean Patent Application No. 2003-50502, filed on Jul. 23, 2003, in the Korean Intellectual Property Office, the disclosure of which is incorporated herein by reference in its entirety.

BACKGROUND OF THE INVENTION

1. Field of the Invention

The present invention relates to a flash memory system, and more particularly, to a method of writing and reading data and parity codes in a flash memory system.

2. Description of the Related Art

In general, a flash memory device is a kind of nonvolatile electrically erasable and programmable read only memory ("EEPROM"), which does not have to be refreshed.

The flash memory device can be categorized as either NOR or NAND type. While a NOR flash memory device accepts a small amount of data at high speed, a NAND flash memory device accepts a large amount of data.

Programming and erasing of a typical NAND flash memory entail controlling of the threshold voltage of a memory cell by injecting and emitting electrons into and from a floating gate.

This NAND flash memory comprises a register, which is typically referred to as a "page buffer," to write a large amount of data in a short amount of time.

Data that has been externally input is written in a memory cell array via the page buffer, and data that has been read from the memory cell array is externally output via the page buffer. Accordingly, data is typically written and read in and from the flash memory in units of the size of the page buffer.

Meanwhile, in a system including a NAND flash memory device, data is written along with a parity code for the data in order to check and/or correct data errors.

A controller generates a parity code for a certain amount of data and writes the data along with the parity code in the flash memory device. Thereafter, the controller reads the parity code from the flash memory device and checks whether or not the data has errors.

With a recent increase in the size of the page buffer of the flash memory, a unit for processing parity codes has also increased. Normally, a parity code is generated for data having a size equal to the size of the page buffer.

That is, the unit of processing parity codes corresponds to data having a size equal to the size of the page buffer. Thus, with increasing the size of the page buffer, hardware for generating parity codes becomes more complicated or overall processing time increases.

SUMMARY OF THE INVENTION

The present invention provides a flash memory system, which increases the efficiency of writing and reading data and parity codes into and from a flash memory device to expedite overall data processing time, and a data writing method thereof.

According to an aspect of the present invention, there is provided a flash memory system comprising a flash memory device and a controller. The flash memory device includes a memory cell array and a page buffer for writing externally input data into the memory cell array. The controller divides data into two or more groups of data, each of which has a smaller size than the size of the page buffer, and serially transmits each group of data and a parity code for the group of data to the flash memory device.

The controller comprises a memory control portion and an Error Correcting/Correction Code ("ECC") circuit. The memory control portion transmits a predetermined command, the data, an address for the data, and a control signal to the flash memory device, and the ECC circuit generates the parity code.

According to another aspect of the present invention, there is provided a flash memory system comprising a flash memory device and a controller. The flash memory device includes a memory cell array and a page buffer for writing and reading data in and from the memory cell array. The controller serially transmits to the flash memory device two or more consecutive data-parity code groups, each of which includes a certain amount of data and a parity code for the data. Herein, each data-parity code group has a smaller size than the size of the page buffer.

According to yet another aspect of the present invention, there is provided a method of writing data into a flash memory system including a flash memory device. The method comprises (a) transmitting a predetermined command and an address signal to the flash memory device; (b) transmitting data to the flash memory device; and (c) generating a parity code for the data and transmitting the parity code to the flash memory device. Herein, steps (b) and (c) are repeated twice or more.

In steps (b) and (c), the data and the corresponding parity code are serially written in a page buffer of the flash memory device.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF PREFERRED EMBODIMENTS

Figure 1:
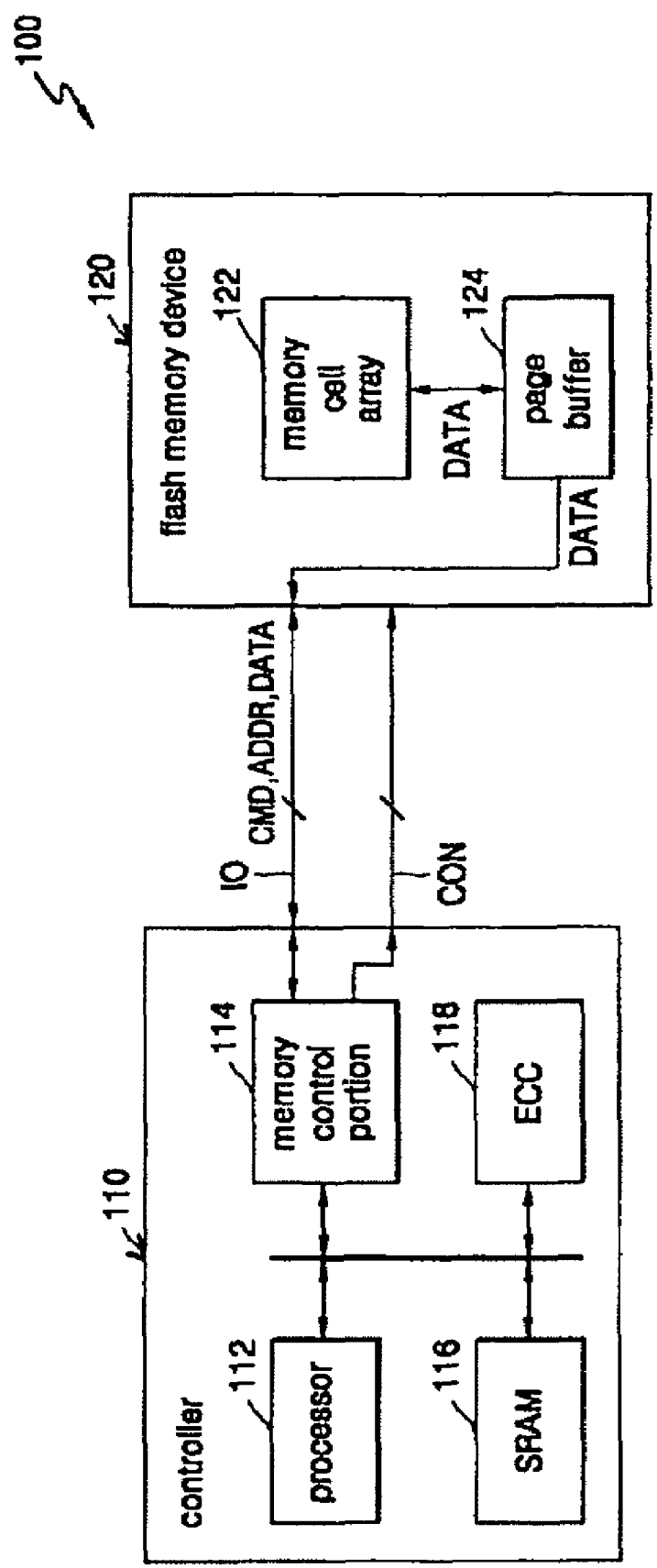
FIG. 1 is a block diagram of a flash memory system according to the present invention.

The present invention will now be described more fully with reference to the accompanying drawings, in which exemplary embodiments of the invention are shown. Like reference numerals are used to denote like elements throughout the drawings.

Referring to FIG. 1, a flash memory system 100 comprises a controller 110 and a flash memory device 120.

The controller 110 comprises a processor 112, a memory control portion 114, and an Error Correcting/Correction Code ("ECC") circuit 118. The processor 112 controls the operation of the controller 110, and the memory control portion 114 interfaces the controller 110 with the flash memory device 120.

The ECC circuit 118 generates parity codes to check and/or correct the errors of data to be written in the flash memory device 120. The ECC circuit 118 is realized by hardware. As shown in FIG. 1, the controller 110 may further comprise an SRAM 116 for writing data.

The flash memory device 120 comprises a memory cell array 122 and a page buffer 124. Although not shown in detail in FIG. 1, the memory cell array 122 comprises a plurality of word lines, a plurality of bit lines, and a plurality of memory cells that are respectively arranged in intersecting portions between the word lines and the bit lines.

The memory cells of the memory cell array 122 are connected to the page buffer 124 via the bit lines. Data that has been externally input is written in the memory cell array 122 via the page buffer 124, and data that has been read from the memory cell array 122 is externally output via the page buffer 124.

Figure 2:
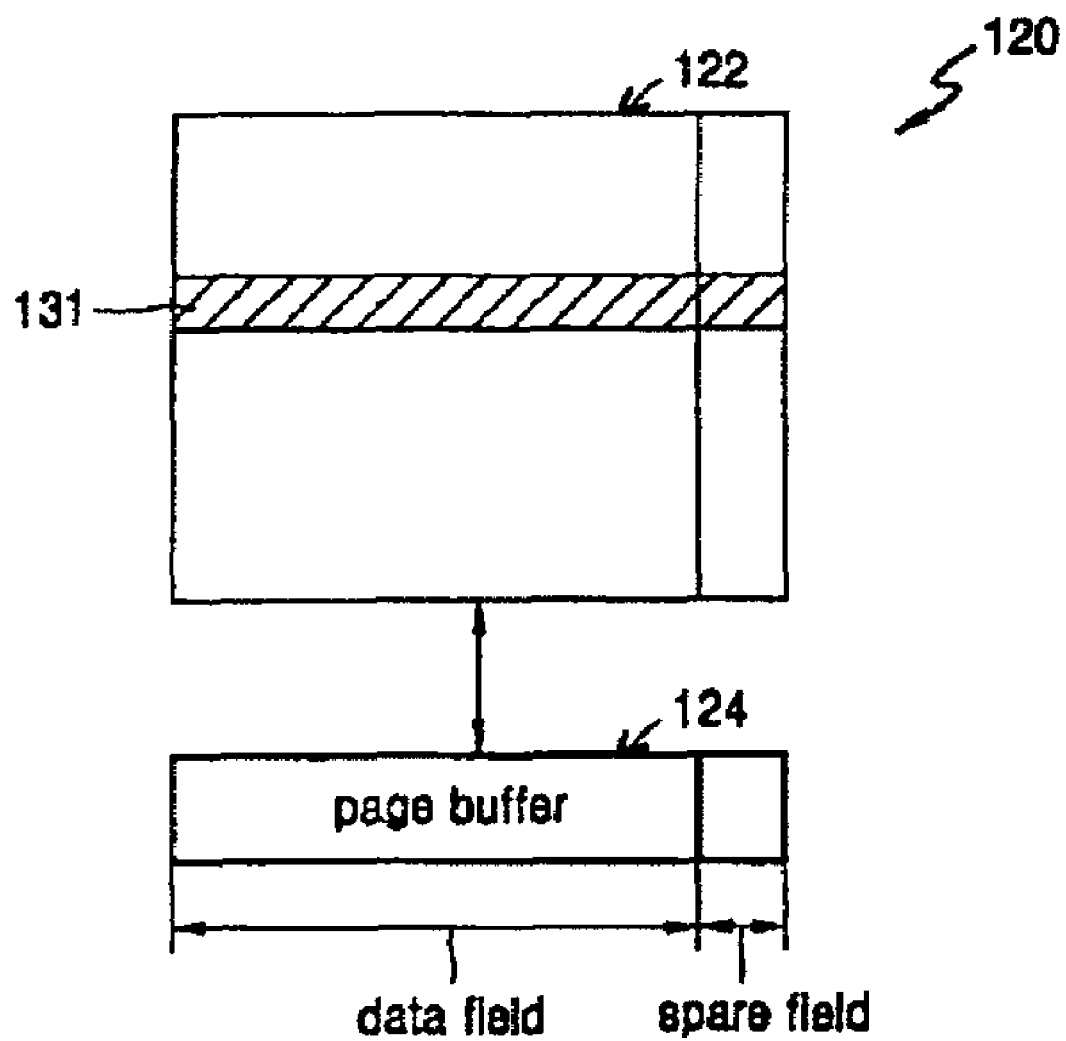
FIG. 2 is a detailed block diagram of a memory cell array and a page buffer of a flash memory device shown in FIG. 1.

FIG. 2 is a detailed block diagram of the memory cell array 122 and the page buffer 124 of the flash memory device 120. In FIG. 2, reference numeral 131 denotes a page, which refers to a plurality of memory cells connected to a single word line.

Thus, the memory cell array 122 comprises a plurality of pages 131. The page buffer 124 is comprised of a data field and a spare field. In a typical flash memory device, the data field and the spare field refer to spaces for writing data and parity codes, respectively. Each page of the memory cell array 122 also is comprised of a data field and a parity field.

The controller 110 is connected to the flash memory device 120 via an input/output ("I/O") bus IO and a control bus CON. The I/O bus IO is comprised of a plurality of signal lines, for example, 8 or 16 signal lines.

Commands CMD, addresses ADDR, and data DATA are transmitted via the I/O bus IO. Control signals are transmitted via the control bus CON to inform whether a signal that is transmitted via the I/O bus IO is a command CMD, an address ADDR, or data DATA.

Figure 3:
FIG. 3 illustrates a method of writing data in the flash memory system according to the present invention.

FIG. 3 illustrates a method 300 of writing data in the flash memory system shown according to the present invention. FIG. 3 shows a process of writing data and parity codes in the flash memory device 120.

Referring to FIG. 3, a first command CMD1, an address ADDR, data DATA1-DATAn and PARITY1-PARITYn, and a second command CMD2 are serially transmitted to the flash memory device 120. The first command CMD1 may be a data loading command. The address ADDR refers to an address of a memory cell array to which data will be input.

The data refers to a plurality of groups of data DATA1-DATAn as well as parity codes PARITY1-PARITYn for the respective groups of data DATA1-DATAn. More specifically, in the flash memory system 100 of the present invention, the controller 110 transmits a portion (e.g., a group) of data DATA1-DATAn, which has a size that can be processed by the ECC circuit 118, to the flash memory device 120. Thereafter, the controller 110 transmits a portion of the parity codes PARITY1-PARITYn for the portion (e.g., the group) of data DATA1-DATAn to the flash memory device 120.

In other words, it is not that the transfer of all of the data corresponding to the size of the data field of the page buffer 124 is followed by the transfer of the parity codes for all of the data, but that all of the data is divided into two or more smaller groups and the transfer of each group of data is followed by the transfer of the parity code for the group such that respective groups of data and parity codes for the respective groups of data are alternately transmitted to the flash memory device 120.

Therefore, a first group of data DATA1, a first parity code PARITY1 for the first group of data DATA1, a second group of data DATA2, a second parity code PARITY2 for the second group of data DATA2, . . . , an nth group of data DATAn, and an nth parity code PARITYn are serially generated from the controller 110 and input to the flash memory device 120.

The first through nth parity codes PARITY1-PARITYn correspond to the first through nth groups of data DATA1-DATAn, respectively. The page buffer 124 serially accepts the transmitted data or parity codes irrespective of the data field and the spare field. Each of the first through nth groups of data DATA1-DATAn may have the same size.

If it is supposed that the data field of the page buffer 124 has a size of N bytes (here, N is a natural number more than 1), each group of data may have a size of bytes of N divided by the number of groups. Here, the number of groups is a natural number more than 2.

For example, it is supposed that the data field of the page buffer 124 has a size of 2K bytes and the spare field has a size of 64 bytes (i.e., the page buffer 124 has a total size of (2K+64) bytes) and a unit of processing parity codes is 512 bytes, the data and the parity codes are written in the page buffer 124 in the order of 512-byte first data, a 16-byte first parity code, 512-byte second data, a 16-byte second parity code, 512-byte third data, a 16-byte third parity code, 512-byte fourth data, and a 16-byte fourth parity. Next, a second command CMD2 is transmitted to the flash memory device 120.

Data reading is performed in the same manner as data writing. In the foregoing example, in which the unit for processing parity codes is 512 bytes, when data is read from the flash memory device 120, the reading of the 512-byte first data DATA1 is directly followed by the reading of the corresponding first parity code PARITY1. Thus, during the reading of the 512-byte second data DATA2, it is possible to check the errors of the first data DATA1 using the first parity code PARITY1.

Accordingly, if it is checked and found that the first data DATA1 has errors, the present reading operation is stopped such that data is read again, so as to cope with the errors promptly.

As described above, when the page buffer 124 has a larger size than the unit of processing parity codes, a group of data corresponding to the unit of processing parity codes is written in the page buffer 124 and then the corresponding parity code generated by the ECC circuit 118 is written in the page buffer 124. Thereafter, the next group of data corresponding to the unit of processing parity codes and the corresponding parity code are serially written in the page buffer 124. By repeating this writing operation, it is not required to accumulate parity codes all together in the page buffer 124.

During the data reading, a group of data corresponding to the unit of processing parity codes and the corresponding parity code are serially read from the page buffer 124, thereby expediting error checking time and facilitating an error checking process. The effect of the present invention becomes clearer in comparison with the following contrastive example.

Figure 4A:
FIGS. 4A and 4B illustrate methods of writing data in a flash memory system according to contrastive examples to the present invention.
Figure 4B:
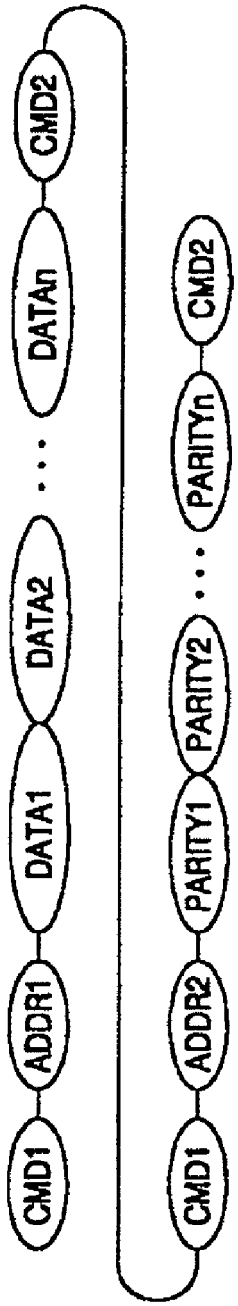

FIGS. 4A and 4B illustrate methods 400 and 450, respectively, of writing data in a flash memory system according to contrastive examples to the present invention.

Referring to FIG. 4A, after a controller 110 transmits a first command CMD1 and an address ADDR1 to a flash memory device 120, consecutive data DATA1-DATAn are serially written in the page buffer 124. Thereafter, consecutive parity codes PARITY1-PARITYn are serially transmitted, and, finally, a second command CMD2 is transmitted to the flash memory device 120.

That is, after the controller 110 transmits all of the data DATA1-DATAn corresponding to the size of a data field to the flash memory device 120 such that the data DATA1-DATAn are written in the data field, all of the parity codes PARITY1-PARITYn are transmitted and written in a spare field.

Referring to FIG. 4B, a controller 110 transmits consecutive data DATA1-DATAn using a first command CMD1, an address ADDR1, and a second command CMD2 such that the data DATA1-DATAn are serially written in one page of a memory cell 122 via a page buffer 124. Thereafter, the controller 110 transmits consecutive parity codes PARITY1-PARITYn corresponding to the data DATA1-DATAn using the first command CMD1, a second address ADDR2, and the second command CMD2 again, such that the parity codes PARITY1-PARITYn are written in another page of the memory cell 122 via the page buffer 124.

In the contrastive example methods shown in FIGS. 4A and 4B, if the page buffer 124 has a larger size than a unit of processing parity codes, to write parity codes in the spare field or another page of the memory cell 122, a parity code generated for each unit of processing parity codes should be stored in an additional memory device of the controller 110 and then transmitted to the flash memory device 120. This may increase the burden of data processing.

Further, during the data reading, the reading of a portion of the data corresponding to the size of a page is followed by the reading of parity codes for the portion of the data, or data and parity codes are non-serially read. Thus, time taken to check errors increases.

In the present invention, a flash memory system interleaves the writing of data and the writing of parity codes for the data irrespective of a data field and a spare field of a page buffer, thereby reducing overall writing time. Also, each parity code is generated for a relatively small amount of data to greatly reduce the burden of the ECC circuit.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A flash memory comprising:
   a memory cell array;
   a page buffer for writing and reading data in the memory cell array; and
   a controller in signal communication with the page buffer;
   wherein the controller divides data into a 1st group of data, a 2nd group of data through an Nth group of data, generates a 1st parity code for the 1st group of data, a 2nd parity code for the 2nd group of data through an Nth parity code for the Nth group of data, and serially transmits a first command, an address for data, the 1st group of data and the 1st parity code, the 2nd group of data and the 2nd parity code through the Nth group of data and the Nth parity code, and a second command to the page buffer.

2. The flash memory of claim 1, wherein each group of data and each parity code are serially written to the page buffer irrespective of a data field and a spare field of the page buffer.

3. The flash memory of claim 1, wherein the first command is a program start command, and the second command is a program end command.

4. The flash memory of claim 1, the controller comprising:
   a memory control portion for transmitting each of commands, an address, group of data, and parity codes to the page buffer; and
   an error correcting code ("ECC") portion for generating the 1st parity code, the 2nd parity code through the Nth parity code.

5. The flash memory of claim 4, wherein each of the 1st group of data, the 2nd group of data through the Nth group of data has a size that can be processed by the ECC portion.

6. A method of writing data to a flash memory, the method comprising:
   dividing data into a 1st group of data, a 2nd group of data through an Nth group of data;
   generating a 1st parity code for the 1st group of data, a 2nd parity code for the 2nd group of data through an Nth parity code for the Nth group of data; and
   serially transmitting a first command, an address for data, the 1st group of data and the 1st parity code, the 2nd group of data and the 2nd parity code through the Nth group of data and the Nth parity code, and a second command to a page buffer.

7. The method of claim 6, wherein each group of data and each parity code are serially written to the page buffer irrespective of a data field and a spare field of the page buffer.

8. The method of claim 6, wherein the first command is a program start command, and the second command is a program end command.

9. The method of claim 6, further comprising:
   writing a page of data from the page buffer to a memory cell array of the flash memory.

10. The method of claim 6, wherein each of the 1st group of data, the 2nd group of data through the Nth group of data has a size that can be ECC-processed.

11. A flash memory system comprising:
   a flash memory device having a memory cell array and a page buffer for writing and reading data in the memory cell array; and
   a controller in signal communication with the page buffer for dividing data into a plurality of data groups and serially transmitting to the page buffer a first command, an address for the data, each of the plurality of data groups in conjunction with each of a corresponding plurality of data group parity codes, respectively, and a second command.

12. The system of claim 11 wherein each of the plurality of data groups and each of the corresponding plurality of parity codes are serially written to the page buffer irrespective of a data field and a spare field of the page buffer.

13. The system of claim 11 wherein the first command is a program start command, and the second command is a program end command.

14. The system of claim 11, the controller comprising:
   a memory control portion for transmitting each of commands, an address, data groups, and parity codes to the page buffer; and
   an error correcting code ("ECC") portion for generating the plurality of data group parity codes.

15. The system of claim 14 wherein each of the plurality of data groups has a size that can be processed by the ECC portion.

16. The system of claim 11 wherein the page buffer comprises an N-byte data field and an M-byte spare field where N and M are each natural numbers greater than one.

17. The system of claim 11 wherein each of the plurality of data groups combined with each of the corresponding plurality of parity codes has a size that is no greater than the size of the page buffer.

18. The system of claim 11 wherein the memory control portion is disposed for transmitting a control signal to at least one of the memory cell array and the page buffer.

19. The system of claim 11, the page buffer comprising:
an N-byte sized data field; and
an M-byte sized spare field,
wherein N and M are each natural numbers, and N+M is no greater than the size of the page buffer.

* * * * *